United States Patent
Vovos et al.

(10) Patent No.: US 12,113,507 B2
(45) Date of Patent: Oct. 8, 2024

(54) DIFFERENTIAL AND COMMON MODE LINK DAMPENER

(71) Applicant: BAE Systems Controls Inc., Endicott, NY (US)

(72) Inventors: Robert J. Vovos, Vestal, NY (US); Peter A. Carruthers, Ithaca, NY (US)

(73) Assignee: BAE Systems Controls Inc., Endicott, NY (US)

( * ) Notice: Subject to any disclaimer, the term of this patent is extended or adjusted under 35 U.S.C. 154(b) by 115 days.

(21) Appl. No.: 18/067,237

(22) Filed: Dec. 16, 2022

(65) Prior Publication Data

US 2024/0204744 A1    Jun. 20, 2024

(51) Int. Cl.
 *H03H 7/42* (2006.01)
 *H03H 7/01* (2006.01)
 *H03H 7/09* (2006.01)

(52) U.S. Cl.
 CPC .......... *H03H 7/427* (2013.01); *H03H 7/0115* (2013.01); *H03H 7/09* (2013.01)

(58) Field of Classification Search
 CPC ..... H03H 7/427; H03H 1/0007; H03H 7/0115
 USPC ........................................ 333/4, 5, 175, 181
 See application file for complete search history.

(56) References Cited

U.S. PATENT DOCUMENTS

| | | | |
|---|---|---|---|
| 6,917,271 B2 | 7/2005 | Zhang et al. | |
| 8,653,931 B2 | 2/2014 | Xu et al. | |
| 11,418,369 B2 | 8/2022 | Gardner | |
| 2004/0174147 A1 | 9/2004 | Vinciarelli | |
| 2008/0080106 A1 | 4/2008 | Mirafzal et al. | |
| 2008/0174255 A1 | 7/2008 | Schnetzka et al. | |
| 2009/0303652 A1 | 12/2009 | Tallam et al. | |
| 2011/0206140 A1 | 8/2011 | Schwager et al. | |
| 2015/0102882 A1 | 4/2015 | Shudarek | |
| 2018/0108472 A1 | 4/2018 | Pagenkopf | |
| 2020/0083883 A1 | 3/2020 | Hutson et al. | |
| 2020/0266854 A1 | 8/2020 | Gardner et al. | |
| 2022/0223328 A1 | 7/2022 | Vornkahl | |

FOREIGN PATENT DOCUMENTS

JP        7115564 B2    8/2022

OTHER PUBLICATIONS

International Search Report, PCT/US23/82501, mailed Apr. 15, 2024, 8 pages.

*Primary Examiner* — Rakesh B Patel
(74) *Attorney, Agent, or Firm* — Scully Scott Murphy & Presser PC; Gary McFaline (57) ABSTRACT

A common mode and a differential mode filter(s) between DC links are provided. Each link has a positive rail and a negative rail. The filter comprises a first inductor respectively connected to each of the positive rail and the negative rail, differential mode damping resistance connected in parallel to each of the first inductor, respectively, and a three-wire choke. The three-wire choke comprises a first wire connected in series with the differential mode damping resistance parallel to the positive rail, a second wire connected in series with the differential mode damping resistance parallel to the negative rail and a third wire connected to common mode damping resistance. The common mode damping resistance is galvanically isolated from differential mode transients flowing through the differential mode damping resistance. The differential mode filter has the differential mode damping resistance, and the common mode filter has the common mode damping resistance.

19 Claims, 7 Drawing Sheets

DIFFERENTIAL AND COMMON MODE LINK DAMPENER

FIELD OF THE DISCLOSURE

This disclosure relates to common mode and differential mode filter(s) between direct current (DC) links connected in series. More specifically, this disclosure relates to a common mode and differential mode filter having separate differential mode damping resistance and common mode damping resistance.

BACKGROUND

Filters are used to dampen transients between links such as DC links. The transients may be in the form of ringing or resonance caused by the inductance of a cable connecting an external device and capacitance on the DC bus(es). The transients may have a common mode and differential mode. Transients in the current flowing through a positive DC link (DC+) and a negative DC link (DC−) are differential mode transients. Parasitic capacitance between the link and ground cause common mode transients.

Certain known filters for common mode and differential mode damping using inductance L and capacitance C, e.g., LC filter or inductance L and resistance R. The inductance may be connected in series with the positive DC link and the negative DC link, respectively. A shunt resistor may be connected in parallel to the link and inductance. The inductance L has contribution to common mode inductance and a differential mode inductance for the filter, where the common mode inductance of the filter is L/2 and the differential mode inductance for the filter is 2L. In these known filters, the resistance is the same for both common mode and differential mode filtering. Since the same resistance is used for both, the $L_{cm}$ R filter for common mode transients and the $L_{dm}$ R filter for differential mode cannot effectively dampen both.

SUMMARY

Accordingly, disclosed is a common mode and a differential mode filter between a first Direct Current (DC) link and a second DC link. Each link has a positive rail and a negative rail. The filter comprises a first inductor respectively connected to each of the positive rail and the negative rail, differential mode damping resistance connected in parallel to each of the first inductor, respectively, and a three-wire choke. The three-wire choke comprises a first wire connected in series with the differential mode damping resistance parallel to the positive rail, a second wire connected in series with the differential mode damping resistance parallel to the negative rail and a third wire connected to common mode damping resistance. The common mode damping resistance is galvanically isolated from differential mode transients flowing through the differential mode damping resistance. The differential mode inductance of the first inductor connected to the positive rail and the first inductor connected to the negative rail, and the differential mode damping resistance provide a differential mode filter for the positive rail and the negative rail. The common mode inductance of the first inductor connected to the positive rail and the first inductor connected to the negative rail, and the common mode damping resistance coupled by the three-wire choke provide a common mode filter.

In an aspect of the disclosure, the differential mode damping resistance is different than the common mode damping resistance such as where the differential mode damping resistance may be less than the common mode damping resistance.

In an aspect of the disclosure, the first inductor connected to the positive rail and the first inductor connected to the negative rail are wrapped around a different core. Additionally, the three wires in the three-wire choke are wrapped around a different core from the first inductor.

In an aspect of the disclosure, the first wire and the second wire may have the same thickness and the third wire may have a smaller thickness.

In an aspect of the disclosure, each wire may have the same number of turns.

In an aspect of the disclosure, each wire may be wrapped around a toroidal core. In an aspect of the disclosure, the three-wire choke may have segmented wiring where the first wire, the second wire and the third wire are separately wound around the toroidal core.

In an aspect of the disclosure, one or more filters as described herein may be installed in a filter module. The filter module may comprise a housing having at least one connection port for a cable. The cable may be connectable to a device external to the filter module. The cable has a pair of wires, e.g., positive wire and negative wire.

In an aspect of the disclosure, the differential mode inductance of the first inductor connected to the positive rail and the first inductor connected to the negative rail may be greater than a differential mode inductance of the pair of wires in the cable of a preset length such as by at least an order of magnitude. In an aspect of the disclosure, the common mode inductance of the first inductor connected to the positive rail and the first inductor connected to the negative rail may be greater than a common mode inductance of the pair of wires in the cable of the preset length such as by at least an order of magnitude.

In an aspect of the disclosure, the device external to the filter module has a first common mode capacitance and a first differential mode capacitance and the filter module is electrically connectable to modular power system having a second common mode capacitance and a second differential mode capacitance. In an aspect of the disclosure, the differential mode damping resistance is based on at least the second differential mode capacitance and the differential mode inductance of the first inductor connected to the positive rail and the first inductor connected to the negative rail and the common mode damping resistance is based on at least the second common mode capacitance and the common mode inductance of the first inductor connected to the positive rail and the first inductor connected to the negative rail.

In an aspect of the disclosure, the differential mode damping resistance is also based on the first differential mode capacitance and a differential mode inductance of the pair of wires in the cable of the preset length and the common mode damping resistance is based on the first common mode capacitance and a common mode inductance of the pair of wires in the cable of the preset length.

In an aspect of the disclosure, the filter module has three connection ports including a first connection port, a second connection port and a third connection port. The filter module also comprises a first DC bus connected to the first connection port, a second DC bus connected to second connection port and a third DC bus connected to the third connector port. The first DC bus may be configured for a higher current than the second DC bus and the third DC bus.

In an aspect of the disclosure, a filter may electrically connect to each set of busbars by contactors. In other aspects, different filters may be connected to the different sets of busbars.

In an aspect of the disclosure, the device external to the filter module may be an external direct current (DC) charger to charge a battery in a vehicle. The filter module may be installed in the vehicle.

DETAILED DESCRIPTION

In accordance with aspects of the disclosure, the values of resistance(s) R_d (differential mode resistance, also referred to herein as differential mode damping resistance) and R_cm (common mode resistance also referred to herein as common mode damping resistance) in a common mode and differential mode filter 1 may be independently determined and may be different to tailor the values as needed to separately suppress the differential mode transients and common mode transients (current transients). This is achieved by galvanic isolating the resistor(s) R_cm (common mode resistance) from the differential mode current (and associated transients) via a three-wire choke 30. Additionally, in accordance with aspects of the disclosure, the three-wire choke 30 is connected in parallel to the main DC bus (positive and negative) 5, 5'. By connecting the three-wire choke 30 in parallel to the main DC bus (positive and negative) 5, 5', any current flowing across the wires 52, 54, 56 is substantially less than the current flowing in the main DC bus 5, 5'. This allows for the size of the three-wire choke 30 to be smaller than if the wires, e.g., the first wire 52 and the second wire 54 were connected in series with the main DC bus (positive and negative) 5, 5'.

Figure 1:
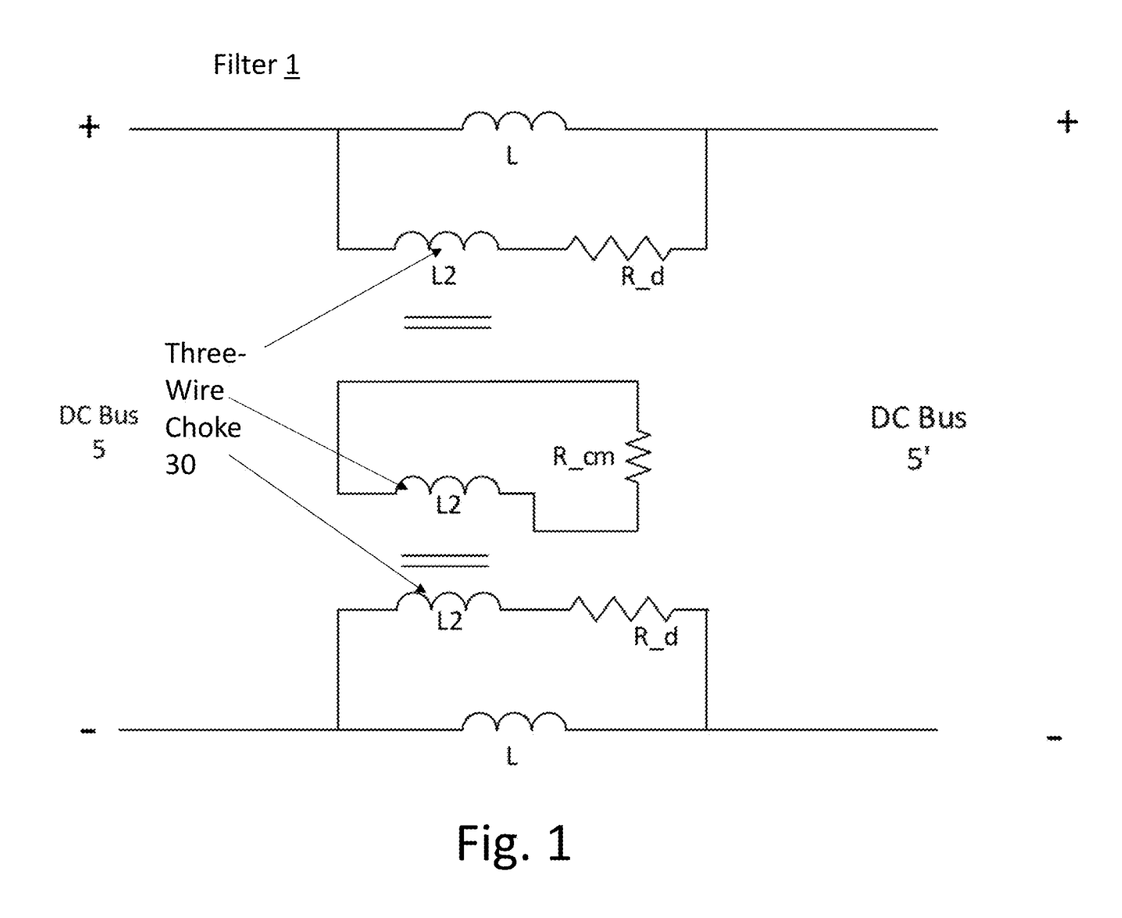
FIG. 1 illustrates a schematic diagram of a common mode and differential mode filter between two DC buses in accordance with aspects of the disclosure.

FIG. 1 illustrates a schematic diagram of a common mode and differential mode filter 1 in accordance with aspects of the disclosure. The common mode and differential mode filter 1 may be used to filter transients (common mode and differential mode) between any two DC bus 5, 5'.

Figure 2A:
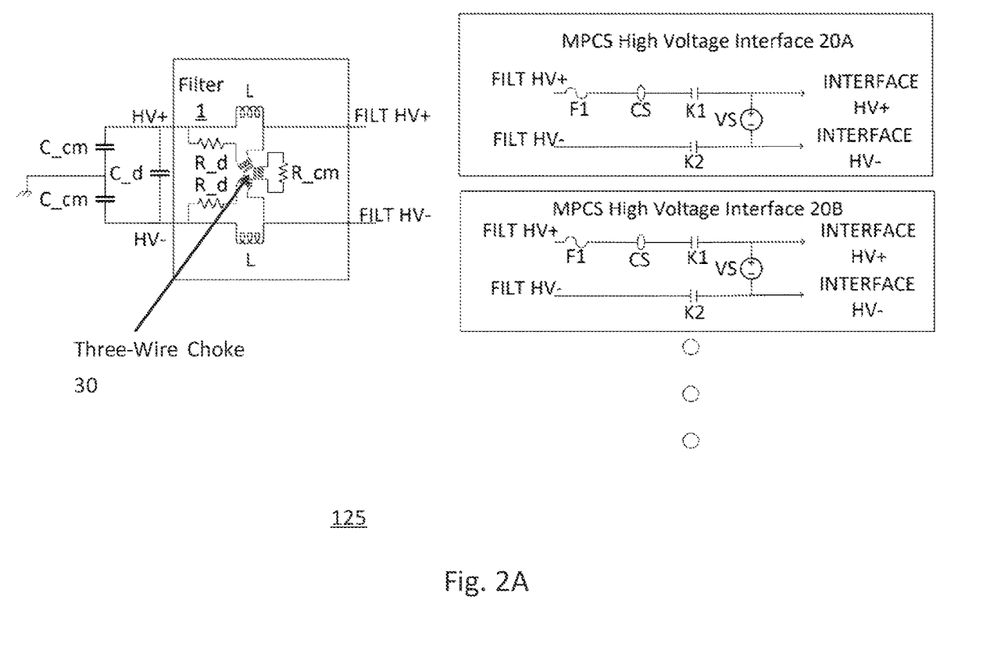
FIG. 2A illustrates an example of a DC filter module having the common mode and differential mode filter in accordance with aspects of the disclosure.

In an aspect of the disclosure, the common mode and differential mode filter 1 may be included in a filter module such as filter module 125. The filter module 125 may have one or more high voltage interfaces (collectively referred to as "20" (shown in FIG. 2A). The high voltage interfaces 20 may be connected to a power source(s) or power sink(s) 210. The power source(s) or power sink(s) 210 may be connected via cables into ports, respectively, in the chassis of the filter module 125. The port has an interface HV+ and HV−. In FIG. 2A (and FIG. 2B), the voltage between the interface HV+ and HV− is identified as VS, which is the voltage of the link. When the high voltage interfaces 20 are included in the filter module 125, it may be electrically connected to the filter 1 which is identified by FILT HV+ and FILT HV−. Similar high voltage interfaces 20 may be included in other modules such as a DC junction module 120 as illustrated in FIG. 5.

Figure 2B:
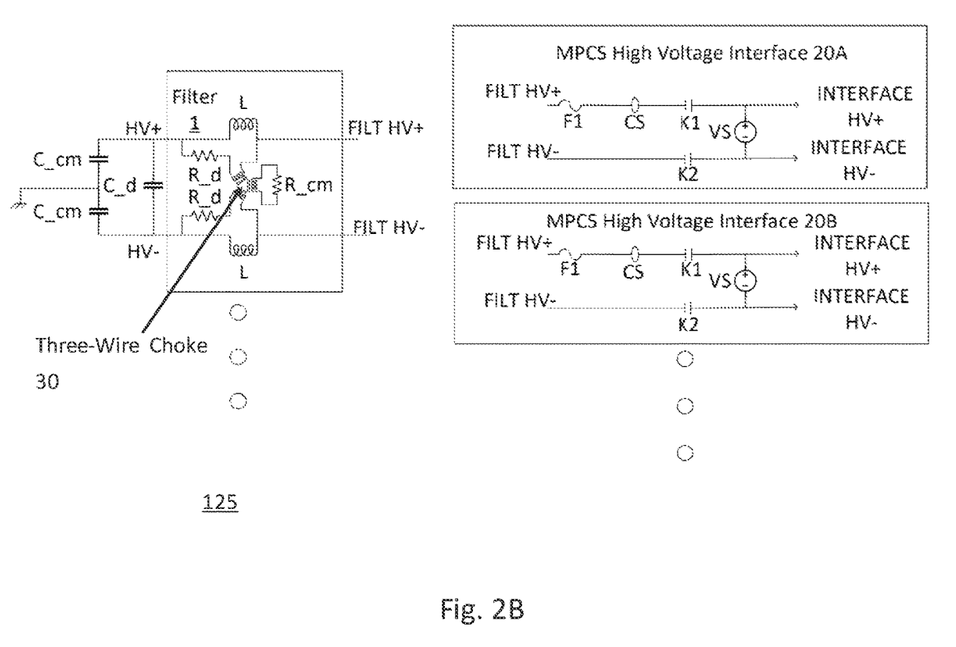
FIG. 2B illustrates an example of a DC filter module having a plurality of common mode and differential mode filters in accordance with aspects of the disclosure.

In an aspect of the disclosure, one filter 1 may be included in an DC filter module 125 and is connectable to the plurality of high voltage interfaces 20. In this aspect, only one of the high voltage interfaces 20 may be used at a time. In other aspects, as shown in FIG. 2B, a plurality of filters 1 may be included in the DC filter module 125, one per high voltage interface 20. In this aspect, each filter 1 may have a different three-wire choke 30, inductor L, common mode resistance R_cm and differential mode resistance R_d, each which may be determined as described herein.

In some aspects of the disclosure, high voltage means greater than 50 V. The specific voltage of the DC bus may be application specific such as 100V, 200V, 400V, 800V etc. . . .

Figure 5:
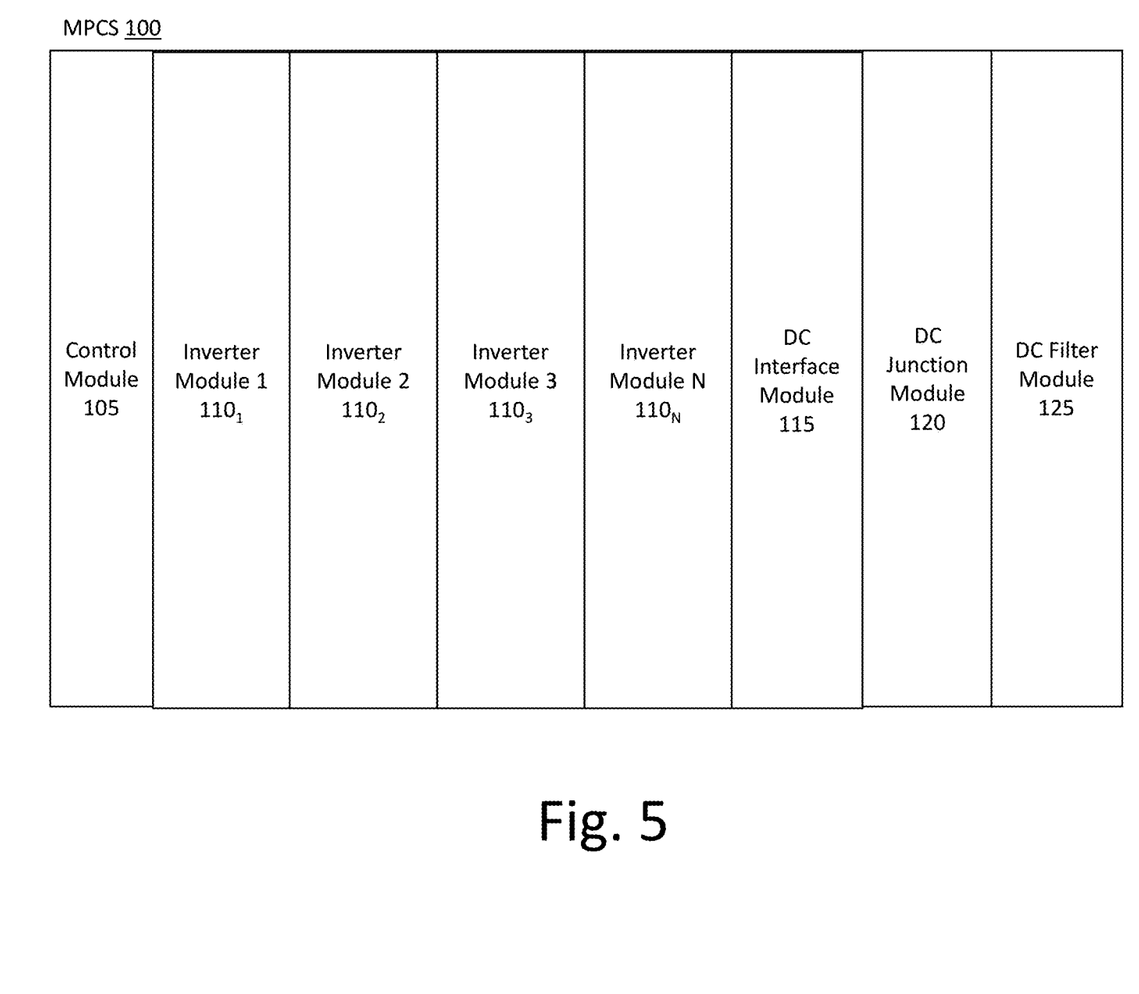
FIG. 5 illustrates a block diagram of an example of a modular power control system in accordance with aspects of the disclosure.

The filter modules 125 may be incorporated into a modular power control system (MPCS) 100, which is illustrated in FIG. 5. A MPCS 100 is a modular line replaceable unit (LRU) containing a plurality of inverters modules $110_{1-N}$ and high voltage power distribution such as a DC interface module 115 and/or a DC junction module 120 and the filter module 125 and a control module 105 such as shown in FIG. 5. The MPCS 100 is scalable and customizable to have any number N of inverters modules 115 and high voltage interfaces 20 and the block diagram illustrated in FIG. 5 is for descriptive purposes only. The number of modules and their respective position may be customized as needed. Different inverter modules $110_{1-N}$ may provide different phases of power.

The DC interface module 115 may also have a plurality of high voltage DC interfaces 20 configured to receive DC power from an external source (or transfer power to a DC sink). The DC interface module 115 may also include isolation monitoring and control of high voltage power distribution and low voltage power distribution in the MPCS 100. The DC interface module 115 may be connected to the common DC bus such as a DC backplane.

The control module 105 may have hardware for controlling the inverter modules 110. In some aspects of the disclosure, different hardware may be used to control difference types of the inverter modules such as three-phase out inverter modules and the multiple single-phase out inverter modules.

The DC junction module 120 may also comprise a plurality of high voltage DC interfaces 20 similar to illustrated in FIG. 2A. The interfaces may be unfiltered. The DC junction module 120 may be also connected to the common DC bus such as a DC backplane. In some aspects of the disclosure, the DC junction module 120 may be connected to the DC backplane via extensions.

The DC bus in each inverter module 1-N $110_{1-N}$ may have a capacitance bank comprising a plurality of capacitors. Each capacitance bank may be a source of differential mode capacitance.

The MPCS 100 may be installed in a vehicle such as a hybrid electric vehicle (HEV) or a battery electric vehicle (BEV). The vehicle may be a personal vehicle, such as a scooter, car, motorcycle and truck or a commercial vehicle such as a truck or bus, a maritime vehicle such as a boat or submarine or a military vehicle such as a tank, self-propelled artillery, or troop transport. The vehicle may also be an airplane, a helicopter, UAV and other powered air vehicles.

The high voltage interfaces 20 such as in the filter module 125 may comprise a fuse F1, a current sensor CS and contactors K1/K2 (e.g., HV interface 20A). The contactor K1 may be for the positive interface rail (Interface HV+) and the contactor K2 may be for the negative interface rail (Interface HV−). Although, not shown in FIG. 2A, the high voltage interface 20 may also have voltage sensors.

In some aspects of the disclosure, the fuse F1 and/or the current sensors CS, and/or the voltage sensors may be omitted. When the filter module 125 comprises multiple high voltage interfaces $20_{A-N}$, different high voltage interfaces may be configured for different current levels. For example, one of the high voltage interfaces, e.g., 20A, may be configured for a first current and a second of the high voltage interfaces, e.g., 20B, may be configured for a second current, where the second current is less than the first current. The first high voltage interface 20A may be used for high-speed charging. For example, the first high voltage interface 20A may support a current of 600 A. This may be used for opportunity charging. The second high voltage interface 20B may support a current of 300 A. This interface 20B may be used for overnight charging. Another high voltage interface (e.g., 20C) may support a third current level.

Each high voltage interface 20 may be connected to an external power source or sink 220. External used in element 220 refers to outside of the MPCS 100 such as outside of a vehicle. The external power source may be a charger or another MPCS 100. The external power sink may be another MPCS 100. In some aspects of the disclosure, the sink of power may also be a utility grid (same utility grid which is a power source).

Figure 6:
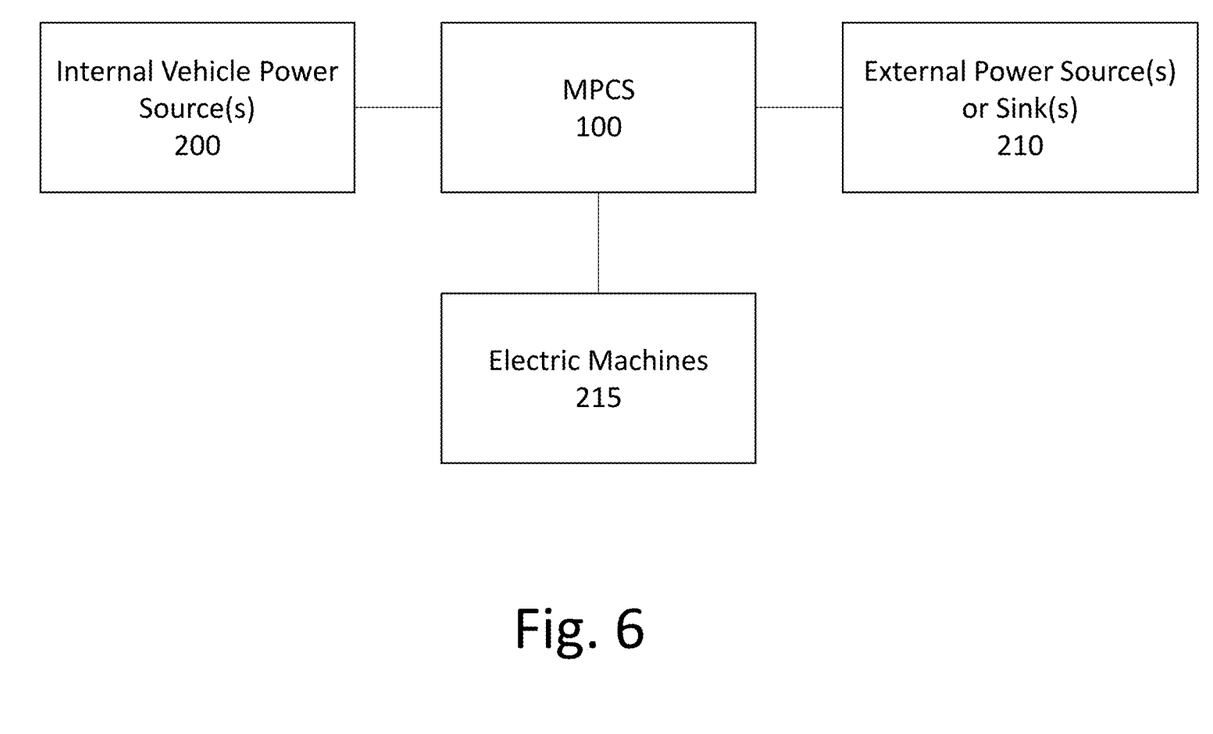
FIG. 6 illustrates a block diagram of an example of a power flow in accordance with aspects of the disclosure.

FIG. 6 illustrates a block diagram of an example of a power flow in accordance with aspects of the disclosure. The system 600 comprises one or more MPCS 100 (and example of which is illustrated in FIG. 5) installed in a vehicle, vehicle power source(s) or sink(s) 200, electric machines 215 and external power source(s) or sinks 210. The vehicle power source(s) or sink(s) 200 may be a high voltage energy storage system (ESS) such as a battery, a low voltage energy storage system such as a battery, such as a starting, lighting and ignition battery (SLI). The SLI battery may be a 24 V battery such as two-12 V batteries connected in series. The SLI battery may be connected to the DC interface module 115. The high voltage battery may provide power for the DC bus including the DC backplane for modules such as the inverter modules 110. The high voltage battery may also receive power (sink) from the external power source 210 such as a charger connected to the HV interface 20 of the filter module 125. Another vehicle power source 200 may be an accessory power supply (APS). The APS may also be modular (MAPS). The MAPS may be connected to the DC interface module 115. The MAPS may power components in the control module 105. The electric machines 215 may be connected to the inverter modules 110. Power is transfer between the electric machine 215 and the inverter modules 110. The vehicle battery (vehicle power source 200) may receive power from the electric machine 215 via the inverter module(s) 110 and the DC backplane.

The filter 1 has an inductance L (such as one or more inductors) connected in series with both the DC+ and DC− rails of the DC bus 5, 5' as shown in FIG. 1 (or HV+, HV− and FILT HV+ and FILT HV− as shown in FIGS. 2A/2B).

The inductor L may be wrapped around a first core. Each inductor L is wrapped around a different core. The core may be made of a ferrite material with a gap or a distributed gap material such as a powdered iron. The inductor L is connected in parallel to shunt resistance R_d (differential mode damping resistance). In an aspect of the disclosure, the differential mode damping resistance may be provided by a plurality of resistors connected in series or parallel (on the parallel path). In other aspects, a single resistor may be used.

Figure 4:
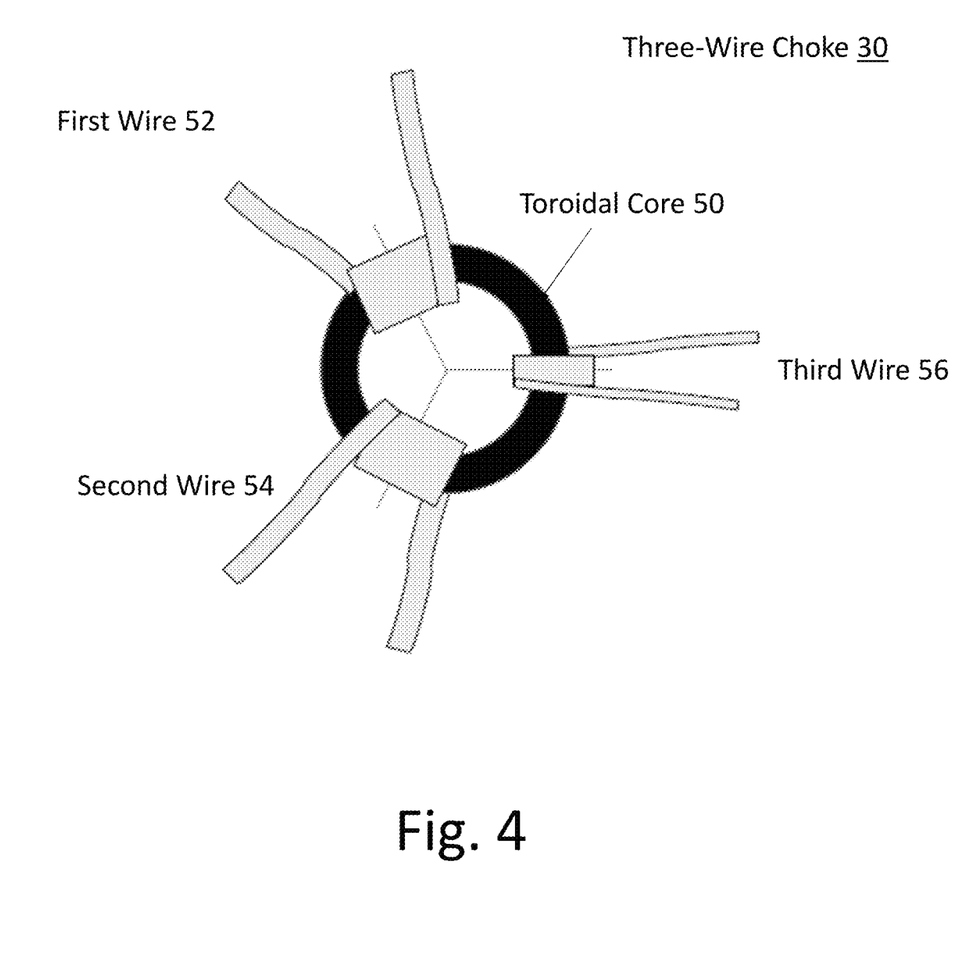
FIG. 4 illustrates an example of a three-wire choke wrapped around a toroidal core in accordance with aspects of the disclosure.

The filter 1 also comprises a three-wire choke 30 for coupling transients to the shunt resistance R_cm (common mode damping resistance). An example of the three-wire choke 30 is illustrated in FIG. 4. One of the wires (first wire 52) is connected in parallel to the DC+ of the DC bus 5, 5' (or HV+, FILT HV+ as shown in FIGS. 2A/2B) and in series with the differential mode damping resistance R_d. The first wire 52 has an inductance of L2. Another of the wires of the three-wire choke 30 (second wire 54) is connected in parallel to the DC− of the DC bus 5, 5' (or HV−, FILT HV− as shown in FIGS. 2A/2B) and in series with the differential mode damping resistance R_d. In an aspect of the disclosure, the second wire 54 may have the same inductance as the first wire 52, e.g., L2.

As connected, the inductor L contributes to both a common mode inductance $L_c$ and a differential mode inductance $L_d$ of the filter. Since the common mode inductance of the filter is formed from the inductor L connected to the DC+ and the inductor L connected to the DC− (which are connected in parallel), the common mode inductance of filter is L/2 (assuming inductance L is the same for both DC+ and DC− and that the inductors are wrapped around different cores.). In contrast, since the differential mode inductance of the inductors are in series with the links DC+, DC−, the differential mode inductance of the filter is 2L.

Both common mode and differential mode transients flow through the first wire 52 and the second wire 54 (and differential mode damping resistance R_d).

The third wire 56 of the three-wire choke 30 is electrically isolated (galvanically) from the DC+ and DC− buses (or HV+, HV− and FILT HV+ and FILT HV− as shown in FIGS. 2A/2B). The third wire 54 is only magnetically connected via coupling between the first wire 52 and the second wire 54. Accordingly, the third wire 56 only sees the common mode transients, magnetically coupled from both the first wire 52 and the second wire 54. Common mode damping resistance R_cm is connected in parallel to the third wire 56. In an aspect of the disclosure, the resistance R_cm may provide by a plurality of resistors connected in parallel or series (in the parallel path with respect to the third wire 56). In other aspects, a single resistor may be used. The third wire 56 may have the same inductance L2 as the first wire 52 and the second wire 54.

Since the common mode damping resistance R_cm is connected in parallel with the third wire 56, which is galvanically isolated from the DC+ and DC− (HV+, HV− and FILT HV+ and FILT HV− as shown in FIGS. 2A/2B) (and also galvanically isolated from differential mode current (and associated transients), only the common mode transients flow across the resistance R_cm. This enables the value of the resistance R_cm to be tailored for only the common mode transients (and not the differential mode transients). This in turn allows for the differential mode damping resistance R_d to be tailored for only the differential mode transients and not the common mode transients even though both the differential mode transients and the common mode current transients cross the differential mode damping resistance R_d.

The differential mode filtering for the DC+ (HV+, FILT HV+) and the DC− (HV−, FILT HV−) is provided by the differential mode inductance of the inductor L connected in series to the DC+/DC−, and the differential mode damping resistance R_d. The common mode filtering is provided by the common mode inductance of the inductor L connected to DC+/DC− and the common mode damping resistance R_cm.

Figure 3:
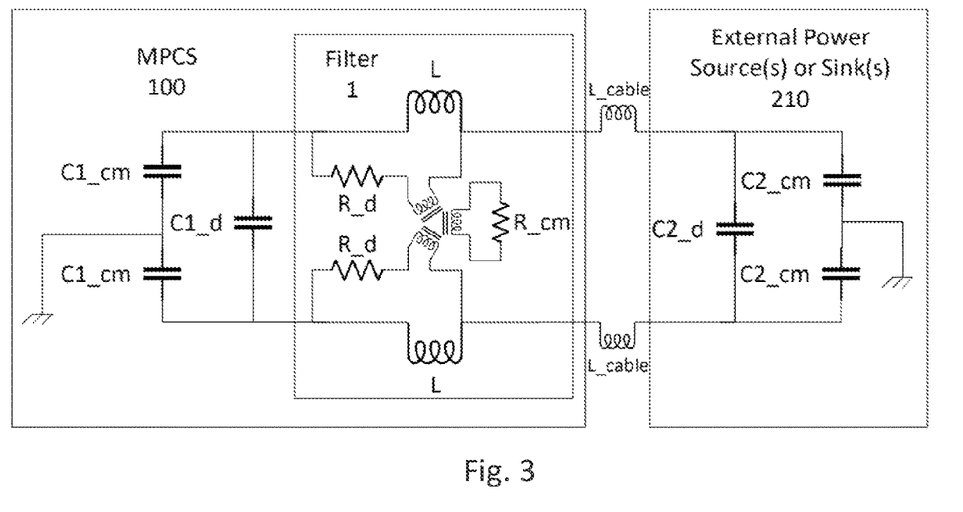
FIG. 3 illustrates a partial schematic diagram of a modular power control system with the common mode and differential mode filter and an external power source or sink.

FIG. 3 illustrates a partial schematic diagram of a MPCS 100 with the filter module 125 having a common mode and differential mode filter(s) 1 in accordance with aspects of the disclosure and an external power source or sink 210.

The external power source or sink 210 may be connected to the filter module 125 via a power cable. The power cable may have an inductance L_cable as illustrated in FIG. 3. The power cable comprises a pair of wires, e.g., a positive wire and a negative wire. Thus, the inductance L_cable also has a common mode inductance L_cable_cm (of the pair of wires) and a differential mode inductance L_cable_d (of the pair of wires). The common mode inductance and differential mode inductance of the wires in the cable may be a function of the cable length and the diameter of the conductors. For example, the cable may be a 50 mm$^2$ or a 70 mm$^2$ cable (8.2 mm diameter). The differential mode inductance and the common mode inductance in both the differential mode filtering and the common mode filtering is set to be larger than the respective inductance of the wires of the cable(L_cable_d and L_cable_cm).

This is to allow the damping resistance R_d and R_cm to dampen the transients. Since the damping resistance R_d and R_cm is parallel to the inductance L, a larger inductor, both differential and common mode (inductance), enables the voltage across the same to be larger and the larger voltage allows for better filtering of the transients.

In an aspect of the disclosure, the common mode inductance and differential mode inductance of the filter may be determined based on a set maximum cable length for the cable connecting the filter module 125 and the source/sink 210. In some aspects of the disclosure, the maximum cable length may be based on the type of system the MPCS 100 is installed in such as the type of vehicle. For example, in a case where the vehicle is a bus, the maximum cable length may be 40 ft. However, in a case when the vehicle is a maritime vehicle, the maximum cable length may be longer. In other aspects, the inductance may be determined for a dedicated cable used for the specific MPCS 100 (or for a specific high voltage interface 20).

In some aspects of the disclosure, the inductance of both the differential mode filtering and the common mode filtering may be an order of magnitude larger than the respective inductance of the wires of the cable as defined above. This is because the inductance L is connected is series with the respective inductance (differential mode/common mode) of the wires in the cable. If the differential and the common mode inductance of the filter is an order of magnitude larger, then the impact on the respective series inductance of the wires in the cable on the equivalent inductance is minimal for both differential inductance and the common mode inductance. For example, the common mode and the differential mode inductance of filter may be in µHs, wherein the corresponding common mode and differential mode inductance of the wires in the cable may be in nHs.

In some aspects of the disclosure, the inductance L of the inductor may be about 10 µH. The differential mode inductance of the filter may be about 20 µm and the common mode inductance may be about 5 µH. For example, the differential mode inductance of the filter may be 24 µm and the common mode inductance of the filter may be 6 µH.

The inductance of the wires 52, 54, 56 may be based on the magnitude of the common mode transient(s). For example, the inductance may be determined such that the three-wire choke 30 does not saturate, e.g., core saturation. The larger the common mode transient(s), the larger the inductance of the three-wires 52, 54, 56.

The inductance of the wires 52, 54, 56 of the three-wire choke may be set so it is larger than the common mode inductance of the inductors L on the positive and the negative rails (DC+, DC−) such that a voltage developed across the wires 52, 54, 56 and the common mode damping resistance R_cm is exposed to the coupled transients.

In some aspects of the disclosure, the inductance of the wires 52, 54, 56 may be the same. For example, the inductance may be about 40-60 µH. For example, the inductance may be 53 µH. However, the inductance is not limited to the example described herein and the example is provided for descriptive purposes only.

Once the inductance L and the inductance of the three-wires 52, 54, 56 are determined, the values for the damping resistance R_cm and R_d may be determined. As illustrated in FIG. 3, the MPCS 100 has a common mode C1_cm capacitance and a differential mode capacitance C1_d. This represents the common mode and differential mode capacitance of the MPCS 100. A majority of the differential mode capacitance is a result of the capacitance banks in each inverter module 110. The capacitance of these capacitor banks may be summed to obtain C1_d (since the capacitor banks are connected in parallel).

The common mode capacitance may be based on respective capacitors that connect the positive DC+ to chassis and the negative DC− to chassis. These capacitors may be EMI capacitors. In some aspects of the disclosure, the differential capacitance may be ordered of magnitude larger than the common mode capacitance of the MPCS 100. For example, the different mode capacitance may be hundreds of microns whereas the common mode capacitance may be hundreds of nano Farads.

Other components of the MPCS 100 may have capacitance, however, relative to the capacitance of the capacitor banks, the other capacitors may be negligible. The differential mode capacitance is generically labeled C_d in FIG. 2A and the common mode capacitance is generically labeled C_cm in FIG. 2A. However, in order to distinguish the same in FIG. 3, the common mode capacitance of the MPCS 100 is referred as C1_cm and the differential mode capacitance of the MPCS 100 is reference to as C1_d.

Similarly, the external source or sink 210 also has a common mode and differential mode capacitance C2_cm and C2_d. In a case, where the external source or sink 210 is another MPCS 100, the common mode and differential mode capacitance may be the same if the two MPCSs 100 have the same configuration or known based on the design.

In a case where the external source or sink 210 is another system such as a charger in a station or roadside, the common mode and differential mode capacitance C2_cm and C2_d may be estimated such as based on worst case. In other aspects of the disclosure, the common mode and differential mode capacitance C2_cm and C2_d may be provided by a manufacturer of the other system.

In other aspects, the common mode and differential mode capacitance C2_cm and C2_d may be estimated to be the same as C1_cm and C1_d. In other aspects, the common mode and differential mode capacitance C2_cm and C2_d may be estimated to be substantially higher than C1_cm and C1_d, which minimizes the impact of the external device since the smaller capacitance dominants the series circuit based on the equivalent capacitance.

The equivalent differential mode capacitance between the MPCS 100 and the external source or sink 210 is:

$$Ceq\_d = \frac{1}{\frac{1}{C1\_cm} + \frac{1}{C2\_d}}$$

The equivalent common mode capacitance between the MPCS 100 and the external source or sink 210 is:

$$Ceq\_cm = \frac{1}{\frac{1}{2C1\_cm} + \frac{1}{2C2\_cm}}$$

Thus, if the common mode and the differential mode capacitance of the external source/sink 210 is significantly larger, Ceq_cm and Ceq_d is about C1_d and C1_cm, respectively, the differential mode capacitance and the common mode capacitance of the MPCS 100.

The damping resistance R_d and the R_cm for the filter 1 may be determined based on the impedance of the circuit defined by the CLC between the MPCS 100 and the external power source/sink 210.

The characteristic impedance is defined by $$Z = \sqrt{\frac{L}{c}},$$

where L is either the equivalent differential mode inductance or the common mode inductance and c is either the equivalent differential mode capacitance or the common mode capacitance as defined above. Since as described above, the differential mode and common mode inductance may be at least an order of magnitude larger than the corresponding inductance of the cable, the equivalent differential mode inductance or the common mode inductance may be estimated by the differential mode inductance or the common mode inductance of the filter, 2L for the differential inductance and L/2 for the common mode inductance. In other aspects, the equivalent common mode and differential mode inductance may be a sum of the inductance 2L+ about 2×differential inductance mode of the wires in the cable or L/2+ about half common mode inductance of the wires in the cable. In this aspect, the differential mode and common mode inductance of the wires in the cable may be estimated. The differential mode inductance of the wires may not be 2 times of the inductance of each wire in the cable because of coupling between the positive/negative. Similarly, the common mode inductance of the wires in the cable may not be half of the inductance of each wire because of coupling between the positive and the chassis and the negative and the chassis.

In an aspect of the disclosure, the common mode resistance is based on the characteristic impedances. For example, the common mode resistance R_cm may be about Z. In an aspect of the disclosure, the differential mode resistance R_d may be about Z/2. However, in some aspects of the disclosure, the differential mode resistance R_d may be about Z, which may generate less loss, however, may provide less damping.

In some aspects of the disclosure, since the magnitude of the differential mode capacitance is higher than the magnitude of the common mode capacitance, the differential mode damping resistance R_d may be lower than the common mode damping resistance R_cm. For example, the differential mode damping resistance R_d may be less than 1Ω. For example, the differential mode damping resistance R_d may be about 0.4Ω. In an aspect of the disclosure, the common mode damping resistance R_cm may be greater than 1Ω. For example, the common mode damping resistance R_cm may be about 2.5Ω.

FIG. 4 illustrates an example of a three-wire choke 30 in accordance with aspects of the disclosure. The three-wire choke 30 has a magnetic core. For example, the magnetic core may be a toroidal core 50. In as aspect of the disclosure, the toroidal core 50 may be a ferrite core. In some aspects of the disclosure, the toroidal core 50 may have an inner diameter of about 35 mm. In some aspects of the disclosure, the toroidal core 50 may have a height of about 15 mm. In some aspects of the disclosure, the toroidal core 50 may be made of a p-type material based on its permeability. Other ferrite materials may be used, or other high permeability materials may be used.

The three-wire choke 30 has three wires 52, 54, 56. The three wires 52, 54, 56 may be separate and separately wrapped around the toroidal core 50. The wires 52, 54, 56 may be wrapped equi-distant from each other. For example, the wrapping centers on the core of the wires 52, 54, 56 may be spaced 120° for each other. 0° may be defined as the wrapping center on the core for the third wire 56. Then the first wire 52 may be wrapped such that the center of the wrapping on the core is 120° and the center of the wrapping on the core for the second wire 54 may be 240°.

In other aspects, the wires 52, 54, 56 may overlap since the wires 52, 54, 56 are insulated.

The wires 52, 54, 56 may wrap around the toroidal core 50 via turns. The number of turns increases the inductance of the wires 52, 54, 56. In some aspects of the disclosure, each wire 52, 54, 56 may have the same number of turns which causes the wires 52, 54 and 56 to have substantially the same inductance. For example, the number of turns for each may be 4.

The gauge of each wire 52, 54, 56 may be based on the magnitude of the common mode transients and the differential mode transients. Since the first wire 52 and the second wire 54 receive substantially the same magnitude of transients, these wires may have the same gauge. Both the common mode transients and the different mode transients flow within the first wire 52 and the second wire 54; however, only the common mode transients flow within the third wire 56. Therefore, the gauge of the third wire 56 may be higher than the gauge of the first wire 52 and the second wire 56 since the third wire 56 is exposed to less current. For example, the first wire 52 and the second wire 54 may have a gauge of about 16 AWG. The third wire 56 may have a gauge greater than 20 AWG. The different gauges are illustrated in FIG. 4 where the third wire 56 is shown as taking up less circumference of the toroidal core 50 than the first wire 52 and the second wire 54.

In the discussion and claims herein, the term "about" indicates that the value listed may be somewhat altered, as long as the alteration does not result in nonconformance of the process or device. For example, for some elements the term "about" can refer to a variation of ±0.1%, for other elements, the term "about" can refer to a variation of ±1% or ±10%, or any point therein. For example, the term about when used for a measurement in mm, may include +/0.1, 0.2, 0.3, etc., where the difference between the stated number may be larger when the state number is larger. For example, about 1.5 may include 1.2-1.8, where about 20, may include 18.0-22.0.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat. "Substantially" when referring to a shape or size may account for manufacturing where a perfect shapes, such as circular or sizes may be difficult to manufacture.

As used herein terms such as "a", "an" and "the" are not intended to refer to only a singular entity, but include the general class of which a specific example may be used for illustration. As used herein, terms defined in the singular are intended to include those terms defined in the plural and vice versa.

References in the specification to "one aspect", "certain aspects", "some aspects" or "an aspect", indicate that the aspect(s) described may include a particular feature or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

For purposes of the description hereinafter, the terms "upper", "lower", "right", "left", "vertical", "horizontal", "top". "bottom", and derivatives thereof shall relate to a device relative to a floor and/or as it is oriented in the figures or with respect to a surface.

Reference herein to any numerical range expressly includes each numerical value (including fractional numbers and whole numbers) encompassed by that range. To illustrate, reference herein to a range of "at least 50" or "at least about 50" includes whole numbers of 50, 51, 52, 53, 54, 55, 56, 57, 58, 59, 60, etc., and fractional numbers 50.1, 50.2, 50.3, 50.4, 50.5, 50.6, 50.7, 50.8, 50.9, etc. In a further illustration, reference herein to a range of "less than 50" or "less than about 50" includes whole numbers 49, 48, 47, 46, 45, 44, 43, 42, 41, 40, etc., and fractional numbers 49.9, 49.8, 49.7, 49.6, 49.5, 49.4, 49.3, 49.2, 49.1, 49.0, etc.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A common mode and a differential mode filter between a first Direct Current (DC) link and a second DC link, each link having a positive rail and a negative rail, the filter comprising:
   a first inductor respectively connected to each of the positive rail and the negative rail;
   a differential mode damping resistance connected in parallel to each of the first inductors, respectively; and
   a three-wire choke comprising a first wire connected in series with the differential mode damping resistance parallel to the positive rail, a second wire connected in series with the differential mode damping resistance parallel to the negative rail and a third wire connected to a common mode damping resistance, where the common mode damping resistance is galvanically isolated from differential mode transients flowing through the differential mode damping resistances of the positive and negative rails,
   wherein a differential mode inductance of the first inductor connected to the positive rail and the first inductor connected to the negative rail, and the differential mode damping resistances of the positive and negative rails, provide a differential mode filter for the positive rail and the negative rail, and
   a common mode inductance of the first inductor connected to the positive rail and the first inductor connected to the negative rail, and the common mode damping resistance coupled by the three-wire choke, provide a common mode filter.

2. The filter of claim 1, wherein the differential mode damping resistance is different than the common mode damping resistance.

3. The filter of claim 2, wherein the differential mode damping resistance is less than the common mode damping resistance.

4. The filter of claim 1, wherein the first inductor connected to the positive rail and the first inductor connected to the negative rail are wrapped around a different core and the first to third wires in the three-wire choke are wrapped around another different core.

5. The filter of claim 1, wherein the first wire and the second wire have the same thickness and the third wire has a smaller thickness than the first and second wire.

6. The filter of claim 5, where each of the first wire, the second wire and the third wire have the same number of turns.

7. The filter of claim 1, wherein the first wire, the second wire and the third wire are wounded around a toroidal core.

8. The filter of claim 7, wherein the three-wire choke has segmented wiring where the first wire, the second wire and the third wire are separately wound around the toroidal core.

9. The filter of claim 1, wherein the filter is installed in a filter module, the filter module comprising a housing having at least one connection port for a cable, the cable being connectable to a device external to the filter module, wherein the differential mode inductance of the first inductor connected to the positive rail and the first inductor connected to the negative rail is greater than a differential mode inductance of a pair of wires in the cable of a preset length.

10. The filter of claim 9, wherein the differential mode inductance of the first inductor connected to the positive rail and the first inductor connected to the negative rail is at least an order of magnitude greater than the differential mode inductance of the pair of wires in the cable of the preset length.

11. The filter of claim 9, wherein the common mode inductance of the first inductor connected to the positive rail and the first inductor connected to the negative rail is greater than a common mode inductance of the pair of wires in the cable of the preset length.

12. The filter of claim 11, wherein the common mode inductance of the first inductor connected to the positive rail and the first inductor connected to the negative rail is at least an order of magnitude greater than a common mode inductance of the pair of wires in the cable of the preset length.

13. The filter of claim 12, where the common mode damping resistance is based on the first common mode capacitance and a common mode inductance of the pair of wires in the cable of the preset length.

14. The filter of claim 11, wherein the device external to the filter module has a first common mode capacitance and a first differential mode capacitance and wherein the filter module is electrically connectable to modular power system having a second common mode capacitance and a second differential mode capacitance, wherein the differential mode damping resistances of the positive and negative rails is based on at least the second differential mode capacitance and the differential mode inductance of the first inductor connected to the positive rail and the first inductor connected to the negative rail.

15. The filter of claim 14, wherein the common mode damping resistance is based on at least the second common mode capacitance and the common mode inductance of the first inductor connected to the positive rail and the first inductor connected to the negative rail.

16. The filter of claim 15, wherein the differential mode damping resistances of the positive and negative rails are also based on the first differential mode capacitance and a differential mode inductance of the pair of wires in the cable of the preset length.

17. The filter of claim 14, wherein the device external to the filter module is an external direct current (DC) charger to charge a battery in a vehicle, wherein the filter module is installed in the vehicle.

18. The filter of claim 1, wherein the filter is installed in a filter module comprising a plurality of connection ports for DC interfaces, respectively, each DC interface has a positive rail and negative rail and wherein the filter module comprises a plurality of filters according to claim 1, one filter per DC interface.

19. The filter of claim 9, wherein the at least one connection port is three connection ports, the three connection ports comprising a first connection port, a second connection port and a third connection port, wherein the filter module comprises a first DC bus connected to the first connection port, a second DC bus connected to second connection port and a third DC bus connected to the third connector port, where the first DC bus is configured for a higher current than the second DC bus and the third DC bus, wherein a filter is electrically connected to each of the first to third DC buses by contactors.

* * * * *